(12) United States Patent
Tange

(10) Patent No.: US 12,444,531 B2
(45) Date of Patent: *Oct. 14, 2025

(54) EMBEDDED MAGNETIC DEVICE INCLUDING MULTILAYER WINDINGS

(71) Applicant: Murata Manufacturing Co., Ltd., Nagaokakyo (JP)

(72) Inventor: Takayuki Tange, Milton Keynes (GB)

(73) Assignee: MURATA MANUFACTURING CO., LTD., Kyoto (JP)

( * ) Notice: Subject to any disclaimer, the term of this patent is extended or adjusted under 35 U.S.C. 154(b) by 251 days.

This patent is subject to a terminal disclaimer.

(21) Appl. No.: 18/024,607

(22) PCT Filed: Sep. 10, 2021

(86) PCT No.: PCT/US2021/049873
§ 371 (c)(1),
(2) Date: Mar. 3, 2023

(87) PCT Pub. No.: WO2022/056268
PCT Pub. Date: Mar. 17, 2022

(65) Prior Publication Data
US 2023/0317349 A1 Oct. 5, 2023

Related U.S. Application Data

(60) Provisional application No. 63/076,530, filed on Sep. 10, 2020.

(51) Int. Cl.
*H01F 27/28* (2006.01)
*H01F 27/26* (2006.01)
(Continued)

(52) U.S. Cl.
CPC ....... *H01F 27/2804* (2013.01); *H01F 27/266* (2013.01); *H01F 27/323* (2013.01);
(Continued)

(58) Field of Classification Search
CPC .......... H01F 27/28; H01F 27/26; H01F 27/32; H01F 41/04; H05K 1/18
(Continued)

(56) References Cited

U.S. PATENT DOCUMENTS

| | | |
|---|---|---|
| 2015/0061817 A1 | 3/2015 | Lee et al. |
| 2015/0194258 A1 | 7/2015 | Scholz |

(Continued)

FOREIGN PATENT DOCUMENTS

| | | |
|---|---|---|
| CN | 104425104 A | 3/2015 |
| WO | 2017/107129 A1 | 6/2017 |

OTHER PUBLICATIONS

Official Communication issued in International Patent Application No. PCT/US2021/049873, mailed on Jan. 3, 2022.
(Continued)

*Primary Examiner* — Tremesha W Burns
(74) *Attorney, Agent, or Firm* — Keating & Bennett, LLP

(57) ABSTRACT

A device includes a substrate; a magnetic core in the substrate and including a hole; a first winding extending through the hole and around the magnetic core; and a second winding extending through the hole, around the magnetic core, and around a portion of the first winding. The first and the second windings only extend around the same half of the magnetic core.

20 Claims, 10 Drawing Sheets

(51) Int. Cl.
 *H01F 27/32* (2006.01)
 *H01F 41/04* (2006.01)
 *H05K 1/18* (2006.01)

(52) U.S. Cl.
 CPC ............. *H01F 41/041* (2013.01); *H05K 1/18* (2013.01); *H01F 2027/2809* (2013.01); *H05K 2201/10515* (2013.01)

(58) Field of Classification Search
 USPC ........................................................ 361/782
 See application file for complete search history.

(56) References Cited

U.S. PATENT DOCUMENTS

| | | |
|---|---|---|
| 2015/0371763 A1 | 12/2015 | Gordin et al. |
| 2018/0122559 A1 | 5/2018 | Francis |
| 2019/0006077 A1 | 1/2019 | Quilici |
| 2020/0243240 A1 | 7/2020 | Chen |

OTHER PUBLICATIONS

Official Communication issued in corresponding Chinese Patent Application No. 202180054898.9, mailed on Aug. 14, 2025, 7 pages.

EMBEDDED MAGNETIC DEVICE INCLUDING MULTILAYER WINDINGS

CROSS REFERENCE TO RELATED APPLICATIONS

This application claims the benefit of U.S. Patent Application No. 63/076,530 filed on Sep. 10, 2020. The entire contents of each application are hereby incorporated by reference.

BACKGROUND OF THE INVENTION

1. Field of the Invention

The present invention relates to embedded magnetic devices, and particularly to embedded magnetic devices with multilayer windings.

2. Description of the Related Art

Power supply devices include magnetic components such as transformers and magnetic cores. The magnetic components typically contribute the most to the weight and size of the power supply device, making miniaturization and cost reduction difficult.

In addressing this problem, it is known to provide low-profile transformers and inductors in which a transformer or inductor is embedded in a cavity in a substrate made of resin, and the necessary input and output electrical connections of the transformer or inductor are formed on the substrate surface. The substrate can be a printed circuit board (PCB) that includes additional solder-resist layers and copper plating layers on the top and/or bottom surfaces of the substrate. The electronic components of the power supply device may then be surface mounted on the substrate. This allows a more compact and thinner power supply device to be made.

In one known method known, a packaged structure having a magnetic component can be integrated into a printed circuit board. In such known method, a cavity is formed in an insulating substrate made of epoxy-based glass fiber, a toroidal magnetic core is placed into the cavity, and the cavity is then filled with an epoxy gel so that the magnetic core is fully covered. The epoxy gel is then cured, forming a substrate having an embedded magnetic core. To provide vias and traces included in the primary and secondary transformer windings, (1) through-holes are drilled in the substrate on the inside and outside circumferences of the toroidal magnetic core, (2) the through-holes are then plated with copper to form vias, and (3) traces are formed on the top and bottom surfaces of the substrate to connect respective vias together into a winding configuration and to form input and output terminals. In this way, coil conductors are created around the magnetic core. The coil conductors of an embedded transformer include coils forming the primary and secondary side windings. Embedded inductors can be formed in the same way but may vary in terms of the input and output connections, the spacing of the vias, and the type of magnetic core used.

A solder resist layer can then be added to the top and the bottom surfaces of the substrate to cover the surface traces, allowing additional electronic components to be mounted on the solder resist layer. In power supply devices, for example, one or more transistors and associated control electronics, such as integrated circuits (ICs) and passive components, may be mounted on the solder resist layer.

Power supply devices manufactured in this way have several associated problems. Air bubbles may form in the epoxy gel as it solidifies. During reflow soldering of the electronic components on the surface of the substrate, these air bubbles can expand and cause failure of the power supply device.

Alternatively, a second known method can be used in which epoxy gel is not used to fill the cavity. In this method, through-holes are first drilled into a solid resin substrate at locations corresponding to the interior and exterior circumference of a toroidal magnetic core. The through-holes are then plated to form the vertical vias of the transformer windings, and metallic caps are formed on the top and the bottom of the vias. A toroidal cavity of the magnetic core is then routed in the solid resin substrate between the vias, and a ring-type magnetic core is placed in the cavity. The cavity is slightly larger than the magnetic core, and an air gap may therefore exist around the magnetic core.

Once the magnetic core has been inserted into the cavity, upper and lower epoxy dielectric layers are added to the substrate to cover the cavity and the magnetic core. Through-holes are drilled through the upper and lower epoxy layers to the caps of the vias that are then plated, and traces are subsequently formed on the top and the bottom surfaces of the substrate to form input and output terminals.

When the embedded magnetic components are transformers, a primary winding is provided on one side of the magnetic core, and a secondary winding is provided on the opposite side of the magnetic core from the primary winding. Transformers of this kind can be used in power supply devices, such as isolated DC-DC converters, in which isolation between the primary and secondary sides is required. The isolation distance is the minimum spacing between the primary and secondary windings.

In these known methods described above, the spacing between the primary and secondary windings must be large enough to achieve a high isolation value, because the isolation is only limited by the dielectric strength of air, in this arrangement, in the cavity or at the top and the bottom surfaces of the device. The isolation value may also be adversely affected by contamination of the cavity or of the surface with dirt.

For many products, safety agency approval is required to certify the isolation characteristics. If the required isolation distance through air is large, there will be a negative impact on product size. For mains reinforced voltages (i.e., 250 Vrms), a spacing of approximately 5 mm is required across a PCB from the primary windings to the secondary windings to meet the insulation requirements of EN/UL60950.

The size and spacing of the vias forming the primary and the second windings of the transformer is therefore largely determined by the specifications for the power supply device. Vias can have a sufficient diameter so that the vias can be successfully plated with metal and so that the traces can be formed in an appropriate winding pattern to connect the vias together. Furthermore, if vias are placed too closely together or too close to other components, such as the magnetic core, the capacitance and isolation characteristics of the power supply device can be adversely affected.

To meet the insulation requirements of EN/UL60950, an isolation distance of 0.4 mm is required through a solid insulator for mains referenced voltages (i.e., 250 Vrms), for example. FIG. 1 is a top view of an embedded magnetic component device with the upper winding layer exposed. The primary winding 410 of the transformer are shown on the left-hand side, and the secondary winding 420 of the transformer are shown on the right-hand side. In an isolated DC-DC converter, for example, the primary winding 410 and the secondary winding 420 of the transformer must be sufficiently isolated from one another. In FIG. 1, the central region of the substrate 305, the region circumscribed by the inner wall of the core cavity (the core cavity is shown by the concentric dotted circles) defines an isolation region 430 between the primary and the secondary windings 410 and 420. The minimum distance between the inner vias 412 and 422 of the primary and the secondary windings 410 and 420 is the isolation distance and is illustrated in FIG. 1 by arrow 432.

FIG. 2 represents a side sectional view of the known device shown in FIG. 1. FIG. 2 shows a core 405, traces 413 forming a portion of the primary windings 410, traces 423 forming a portion of the secondary windings 420, outer vias 411 and 421, and inner vias 412 and 422. As shown, the distance 432 between the primary and secondary side can be reduced to about 0.4 mm, for example, allowing significantly smaller devices to be produced, as well as devices with a higher number of windings.

However, the device shown in FIGS. 1 and 2 has problems with coupling between the primary and the secondary windings 410 and 420 and with high leakage inductance. In operation, a large leakage inductance causes a voltage surge that can result in damage to connected circuitry, including the switching components. Additionally, leakage inductance causes a power transfer delay and poor load regulation when the circuit is operating at high frequency. The space inside the core is limited, and the device size would need to increase if more winding turns and corresponding through holes are needed, while maintaining the minimum isolation distance.

SUMMARY OF THE INVENTION

To overcome the problems described above, preferred embodiments of the present invention provide compact embedded magnetic component devices with windings wrapped around one side of a magnetic core and with improved coupling and reduced leakage inductance.

According to a preferred embodiment of the present invention, an embedded magnetic component device includes an insulating substrate including a first side, a second side opposite the first side, and a cavity; a magnetic core included in the cavity and including an inner periphery and an outer periphery; a first electrical winding that extends through the insulating substrate and around the magnetic core; and a second electrical winding that extends through the insulating substrate and around the magnetic core. Each of the first and the second electrical windings includes upper traces located on the first side of the insulating substrate; lower traces located on the second side of the insulating substrate; inner conductive connectors extending through the insulating substrate adjacent to the inner periphery of the magnetic core, the inner conductive connectors respectively defining electrical connections between respective upper traces and respective lower traces; and outer conductive connectors extending through the insulating substrate adjacent to the outer periphery of the magnetic core, the outer conductive connectors respectively define electrical connections between the respective upper traces and the respective lower traces. The first electrical winding is closer to the magnetic core than the second electrical winding.

The upper and lower traces of the second electrical winding can be wider than the upper and lower traces of the first electrical winding. The second electrical winding can include two outer conductive connectors between each of the respective upper traces and each of the respective lower traces. The second electrical winding can overlap the first electrical winding. The upper traces of the first electrical winding can be on a different layer of the insulating substrate than the upper traces of the second electrical winding, and the lower traces of the first electrical winding can be on a different layer than the upper traces of the second electrical winding. The magnetic core can be octagonally shaped.

The embedded magnetic component device can further include a first isolation layer located on the first side of the insulating substrate between the first electrical winding and the second electrical winding, and a second isolation layer located on the second side of the insulating substrate between the first electrical winding and the second electrical winding. The first isolation layer and/or the second isolation layer can include a single layer.

According to a preferred embodiment of the present invention, an electrical circuit includes a circuit substrate, the embedded magnetic component device of any one of the various other preferred embodiments of the present invention mounted to a first surface of the circuit substrate, and electronic components mounted on the first surface of the circuit substrate between the device and the circuit substrate.

Electronic components can be mounted on a second surface of the circuit substrate that is opposite to the first surface.

According to a preferred embodiment of the present invention, a method of manufacturing an embedded magnetic component device includes forming a cavity in an insulating substrate that includes a first side and a second side opposite the first side, installing a magnetic core in the cavity, the magnetic core including an inner periphery and an outer periphery, forming a first electrical winding that extends through the insulating substrate and around the magnetic core, and forming a second electrical winding that extends through the insulating substrate and around the magnetic core. Each of the first and the second electrical windings includes upper traces located on the first side of the insulating substrate; lower traces located on the second side of the insulating substrate; inner conductive connectors extending through the insulating substrate adjacent to the inner periphery of the magnetic core, the inner conductive connectors respectively defining electrical connections between respective upper traces and respective lower traces; and outer conductive connectors extending through the insulating substrate adjacent to the outer periphery of the magnetic core, the outer conductive connectors respectively defining electrical connections between the respective upper traces and the respective lower conductive traces. The first electrical winding is closer to the magnetic core than the second electrical winding.

The upper and lower traces of the second electrical winding can be wider than the upper and lower traces of the first electrical winding. The second electrical winding can include two outer conductive connectors between each of the respective upper traces and each of the respective lower traces. The second electrical winding can overlap the first electrical winding. The upper traces connected to the first electrical winding can be on a different layer than the upper traces connected to the second electrical winding, and the lower traces connected to the first electrical winding can be on a different layer than the lower traces connected to the second electrical winding. The magnetic core can be octagonally shaped.

The method can further include forming a first isolation layer located on the first side of the insulating substrate between the first electrical winding and the second electrical winding, and forming a second isolation layer located on the second side of the insulating substrate between the first electrical winding and the second electrical winding. The first isolation layer and/or the second isolation layer can include a single layer.

According to a preferred embodiment of the present invention, a method of providing an electrical circuit includes providing the embedded magnetic component device of any one of the various other preferred embodiments of the present invention, providing a circuit substrate, mounting electronic components to a first surface of the circuit substrate, and mounting the embedded magnetic component device to the first surface of the circuit substrate.

The method can further include mounting electronic components to a second surface of the circuit substrate that is opposite to the first surface.

According to a preferred embodiment of the present invention, a device includes a substrate; a magnetic core in the substrate and including a hole; a first winding extending through the hole and around the magnetic core; and a second winding extending through the hole, around the magnetic core, and around a portion of the first winding. The first and the second windings only extend around a same half of the magnetic core.

Each of the first and the second windings can include top and bottom traces connected by inner and outer traces; the top traces of the first winding and the top traces of the second winding can be on different layers of the substrate; the bottom traces of the first winding and the bottom traces of the second winding can be on different layers of the substrate; the inner vias of the first and the second windings can be located within the hole; and the outer vias of the first and the second windings can be located on an exterior of the magnetic core. The inner vias of the first winding can be arranged in first and second rows, and the inner vias of the second winding can be arranged in a third row.

The magnetic core can have an octagonal shape, and the outer vias of the primary windings and the secondary windings can be arranged along three sides of the magnetic core. The device can further include a first insulation layer between the top traces of the first winding and the top traces of the second winding. The device can further include a second insulation layer covering the top traces of the second winding and a third insulation layer covering the bottom traces of the second winding.

According to a preferred embodiment of the present invention, a module includes a module substrate and the device of one of the various other preferred embodiments of the present invention mounted to the module substrate. The module can be a resonant converter with a resonant frequency determined by an overlap of the first and the second windings.

The above and other features, elements, characteristics, steps, and advantages of the present invention will become more apparent from the following detailed description of preferred embodiments of the present invention with reference to the attached drawings.

DETAILED DESCRIPTION OF PREFERRED EMBODIMENTS

Figure 3:
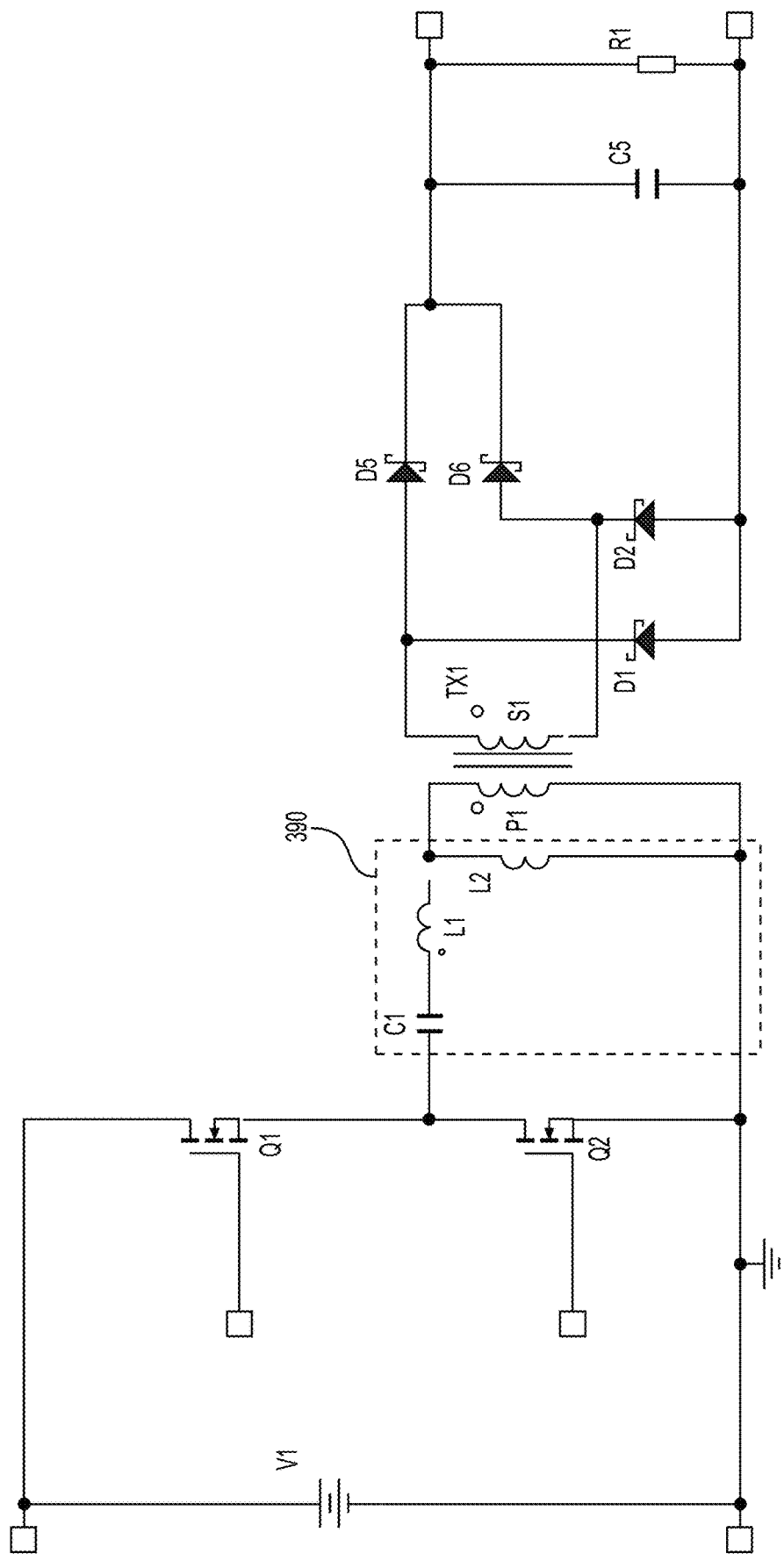
FIG. 3 is a schematic of a DC-DC converter circuit that can include an embedded magnetic device.

FIG. 3 shows a schematic of a DC-DC converter circuit that can include an embedded magnetic device. The DC-DC converter includes an input voltage V1; a switching stage including two transistors Q1 and Q2; a resonant tank 390 including a resonant capacitor C1, a resonant inductor L1, and a magnetizing inductor L2; a transformer TX1 including a primary winding P1 and a secondary winding S1; a rectification stage including diodes D1, D2, D5, and D6 in a bridge arrangement; an output capacitor C5; and a resistor R1 representing the load. The transistors Q1, Q2 are connected in series and are connected to the input voltage V1. The resonant tank 390 is connected between a node between the transistors Q1, Q2 and the transformer TX1. The resonant capacitor C1 and resonant inductor L1 can be connected in series but other arrangements are possible. The resonant inductor L1 can be the leakage inductance of the transformer TX1. The magnetizing inductor L2 is connected in parallel with the primary winding P1.

In the resonant topology shown in FIG. 3, the resonant inductance L1 can be adjusted to achieve the desired resonance frequency, which can be accomplished with a multi-layered embedded transformer TX1 shown FIGS. 4-8.

Figure 4:
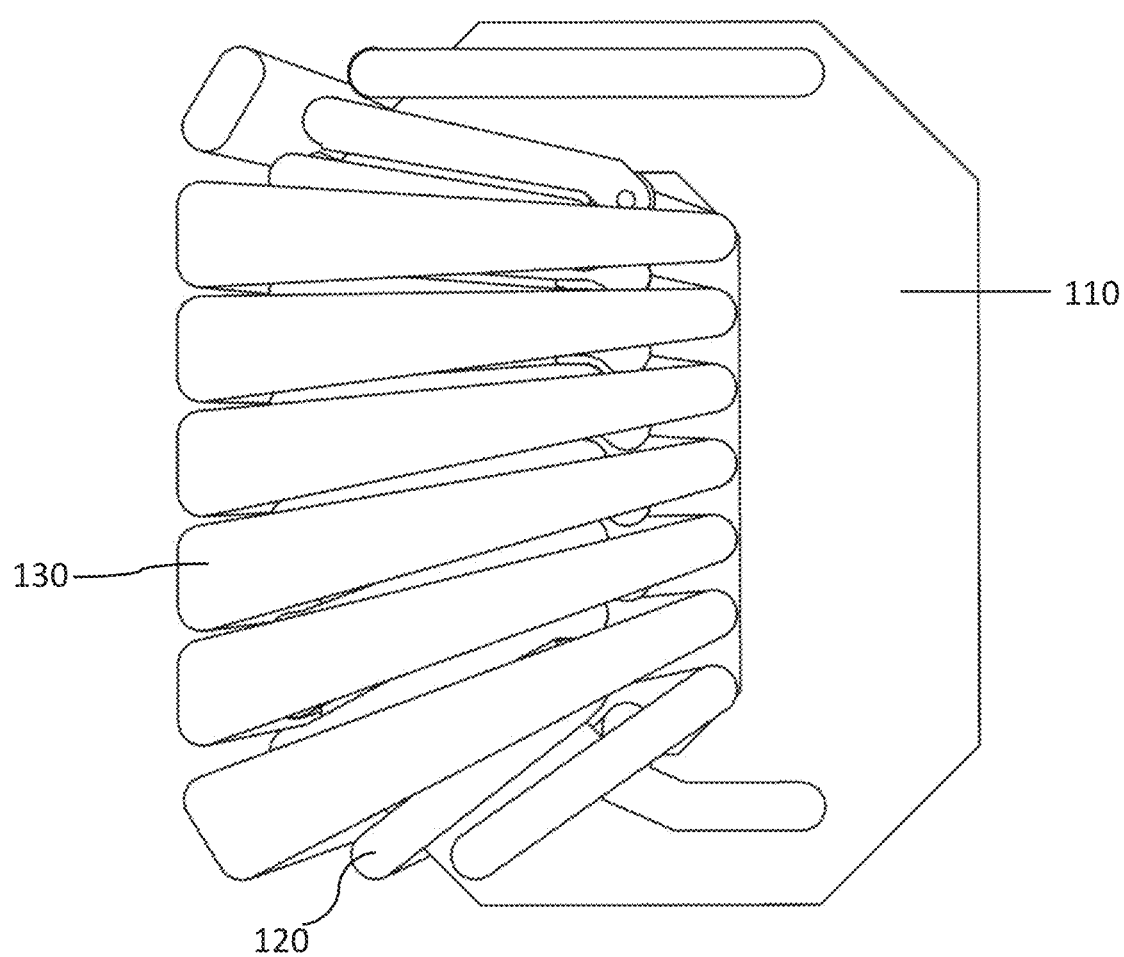
FIGS. 4-8 are views of an embedded magnetic device with windings wrapped around one side of a magnetic core.
Figure 5:
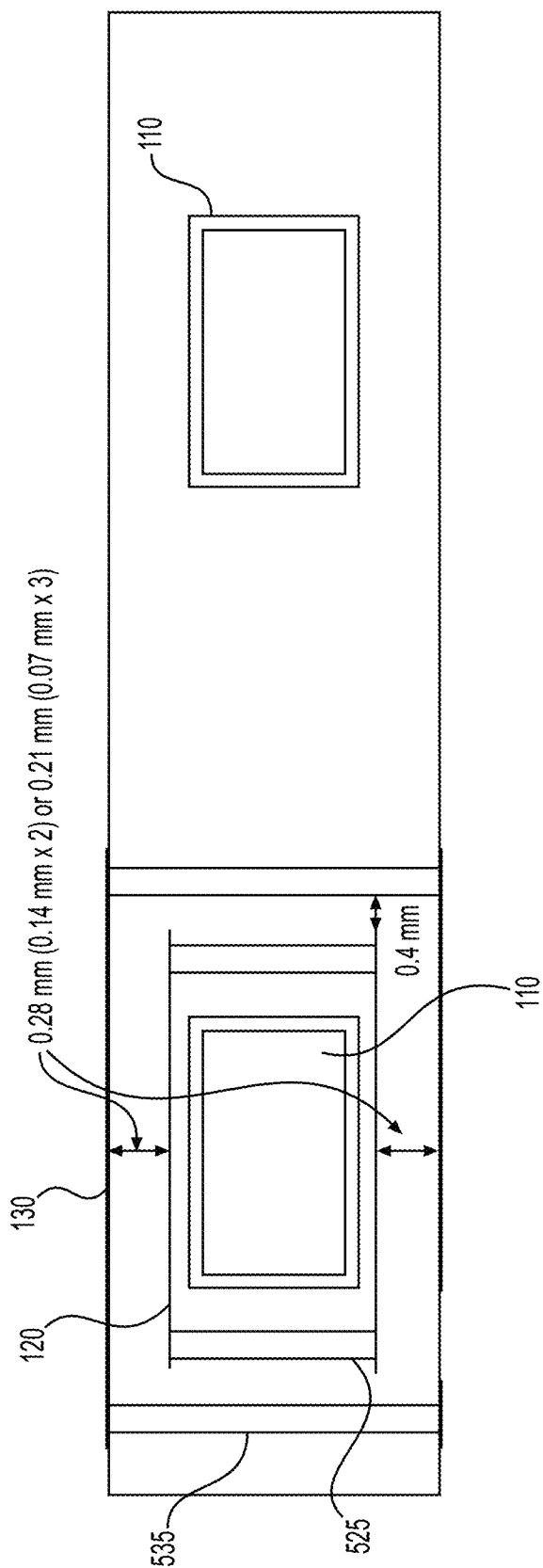
Figure 6:
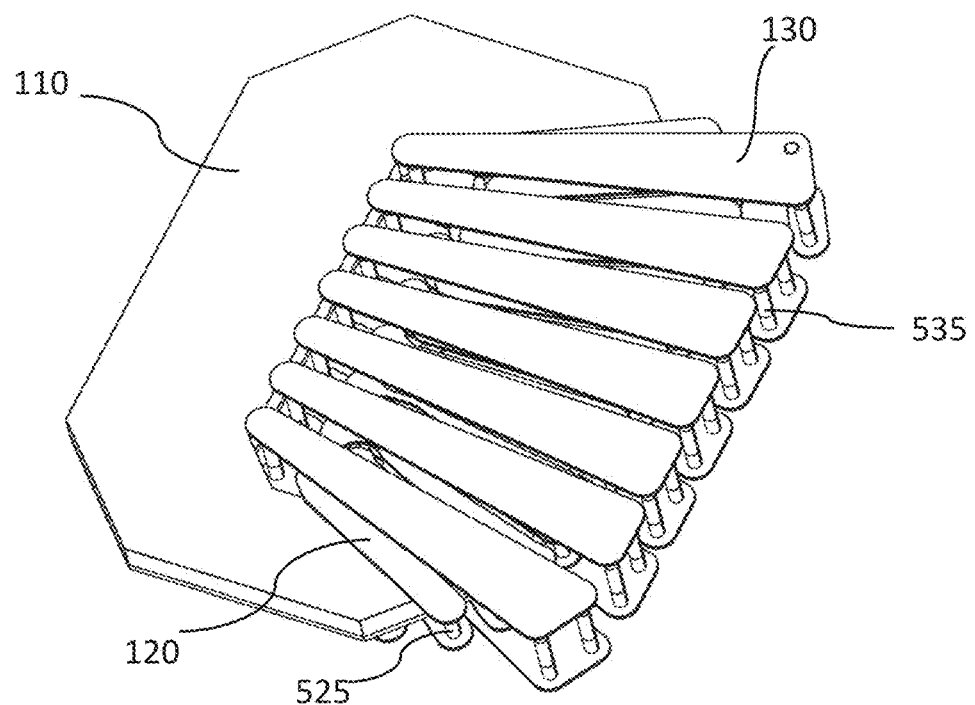
Figure 7:
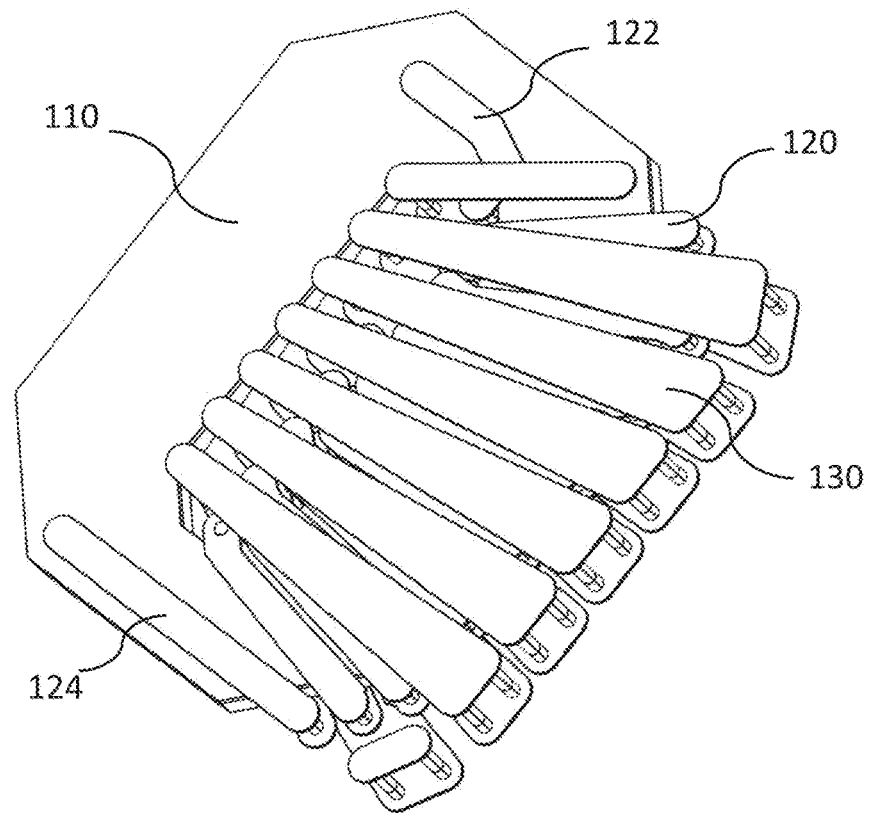
Figure 8:
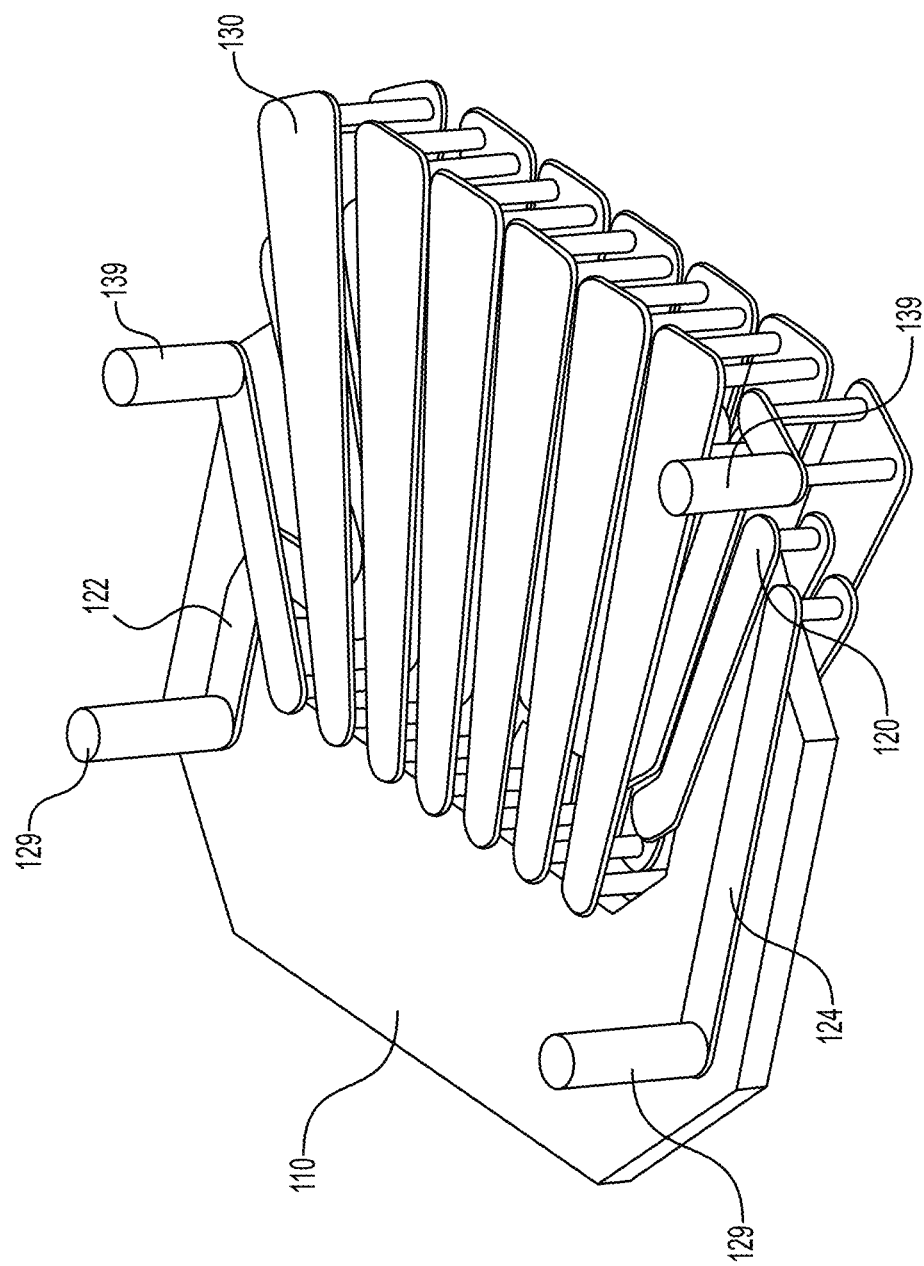

FIG. 4 is a bottom view, FIG. 5 represents a side sectional view, FIG. 6 is a top perspective view, and FIGS. 7 and 8 are bottom perspective views of an embedded magnetic device with a primary winding 120 and a secondary winding 130 wrapped around one side of a magnetic core 110.

FIG. 4 shows an embedded transformer with multi-layer windings that includes magnetic core 110, a primary winding 120, and a secondary winding 130 outside of the primary winding 120. The magnetic core 110 shown in FIG. 4 is octagonal shaped, but other shapes, including, for example, rectangular, can be used. Each of the primary winding 120 and secondary windings 130 are defined by traces connected by vias or by conductive connectors. Although the secondary winding 130 is shown to be outside of the primary winding 120, the inner winding could be the secondary winding 130, and the outer winding could be the primary winding 120.

The primary winding 120 and the secondary winding 130 extend only around the same half of the magnetic core 110. No turns of either the primary winding 120 or the secondary winding 130 extend around the other half of the magnetic core 110. The primary winding 120 and the secondary winding 130 can have any number of turns.

The primary windings 120 can include two rows of inner vias in a hole through the magnetic core 110 and one row of outer vias on the exterior of the magnetic core 110. The secondary winding 130 can include one row of inner vias in the hole through the magnetic core 110 and one row of outer vias on the exterior of the magnetic core 110.

As shown in FIG. 4, the inner vias of the primary winding 120 and the secondary winding 130 can be arranged in three rows. But other arrangements are also possible.

As shown in FIG. 4, the row of outer vias of the primary windings 120 can be adjacent to and can extend along a portion of the periphery of the magnetic core 110. The row of outer vias of the secondary winding 130 can be adjacent to the row of outer vias of the primary winding 120 and spaced farther away from the magnetic core 110 than the row of outer vias of the primary winding. The outer vias of the primary winding 120 and the secondary winding 130 can extend along a portion of the periphery of the magnetic core 110 that is less than half of the total periphery of the magnetic core 110. For example, if the magnetic core 110 has an octagonal shape as shown in FIG. 4, then the outer vias of the primary winding 120 and the secondary winding 130 can extend along one, two, or three sides of the magnetic core 110. If the magnetic core 110 has a rectangular shape, then the outer vias of the primary winding 120 and the secondary winding 130 can extend along one side of the magnetic core 110.

The hole of the magnetic core 110 defining an inner periphery of the magnetic core 110 can have any suitable shape. For example, in FIG. 4, the inner and outer peripheries can both have the same octagonal shape. But the inner and outer peripheries can have different shapes.

Although not shown, the magnetic core 110 can be housed within a cavity that can be formed in an insulating substrate. The substrate can include a resin material, such as FR4 or G10. FR4 and G10 are composite "pre-preg" materials composed of woven fiberglass cloth impregnated with an epoxy resin binder. The resin is pre-dried, but not hardened, so that when it is heated, it flows and acts as an adhesive for the fiberglass material. These materials have been found to have favorable thermal and insulation properties. The magnetic core 110 is then installed in a cavity in the substrate. The cavity may be slightly larger than the magnetic core 110, so that an air gap may exist around the magnetic core 110. Alternatively, the space between the magnetic core 110 and surfaces defining the cavity can be filled with a resin, a gel, or any other suitable material. The magnetic core 110 may be installed in the cavity manually or by a surface mounting device such as a pick and place machine.

A first insulating layer is secured or laminated on the top of the substrate to cover the cavity and the magnetic core 110. The first insulating layer can include a first metal layer used as traces of a portion of the primary winding 120 or the metal layer can be subsequently added. The bottom surface of the substrate can include a second metal layer used as traces of another portion of the primary winding 120 or the second metal layer can be subsequently added. Optionally, a second insulating layer and second metal layer can be secured to the bottom of the substrate.

Subsequently, a third insulating layer and a third metal layer is secured or laminated on the top of the first insulating layer and used as the traces of one a portion of the secondary winding 130. A fourth insulating layer and a fourth metal layer is secured or laminated on the bottom surface of the substrate or the second insulating layer and used as the traces of another portion of the secondary winding 130.

Additional insulating layers can be used. For example, one or more additional insulating layers can be included between the substrate and the first insulating layer, one or more additional insulating layers can be included between the first insulating layer and the third insulating layer, one or more additional insulating layers can be included between the substrate and the second insulating layer, and one or more additional insulating layers can be included between the fourth insulating layer and either the substrate or the second insulating layer.

The added insulating layers can be formed of the same material as the substrate as this facilitates bonding between the top and the bottom surfaces of the substrate and the intermediate insulating layers. The added insulating layers can therefore be laminated onto the substrate and each other. Lamination may be performed by applying an adhesive or by performing heat activating bonding between layers of pre-preg material. The substrate and additional insulating layers can be FR4, G10, or any other suitable material. Alternatively, the added insulating layers and the substrate can include different materials.

FIG. 5 represents a side sectional view of the transformer shown in FIG. 4. FIG. 5 shows that vias 525 and 535 can be formed through the substrate and additional insulating layers to connect the top and bottom winding layers to each other. FIG. 5 shows the magnetic core 110, the primary winding 120, the secondary winding 130, vias 525 connecting the inner layers of the primary winding 120, and vias 535 connecting the outer layers of the secondary winding 130.

Figure 1:
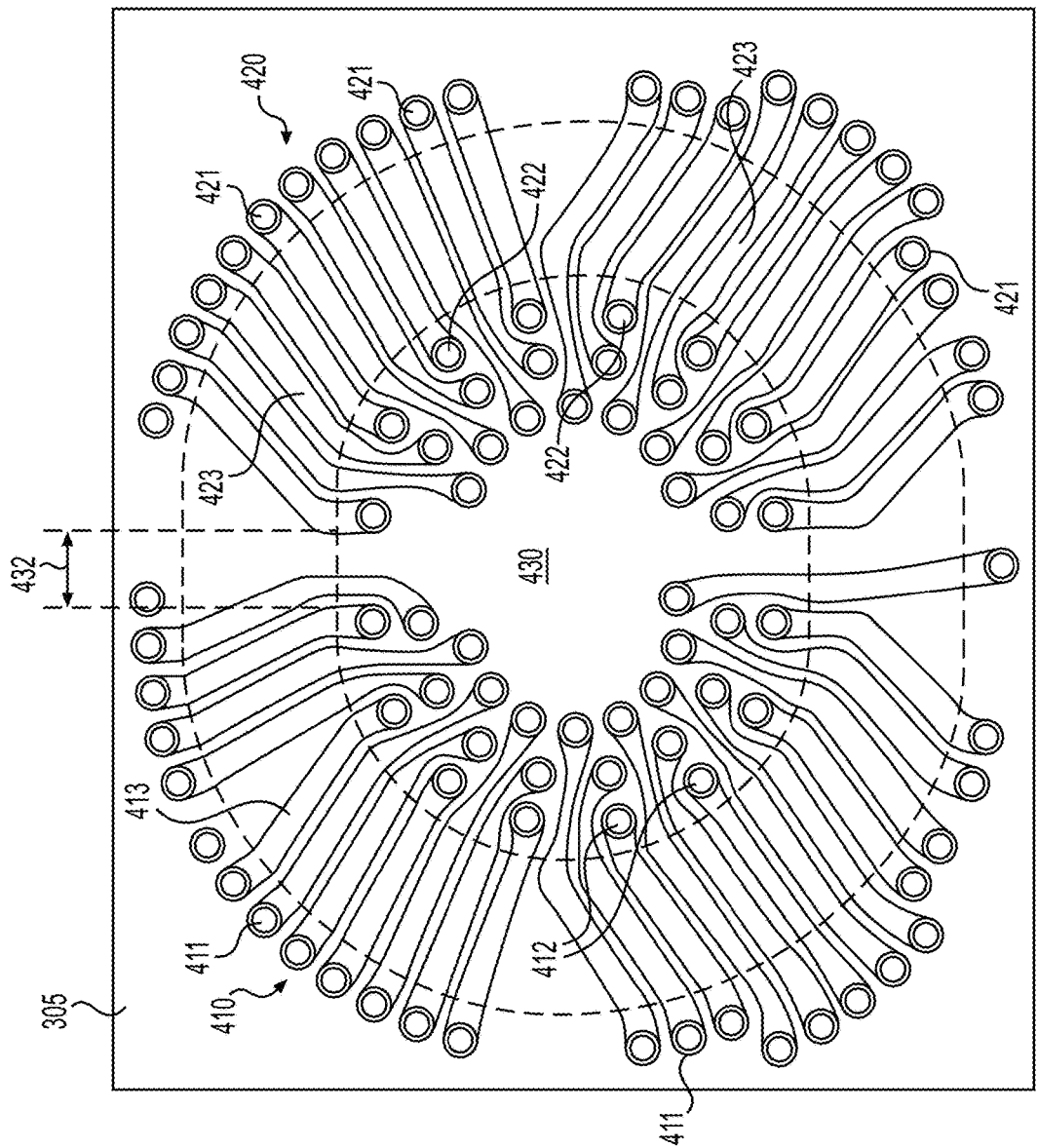
FIG. 1 shows a top down view of an embedded magnetic component of the related art.
Figure 2:
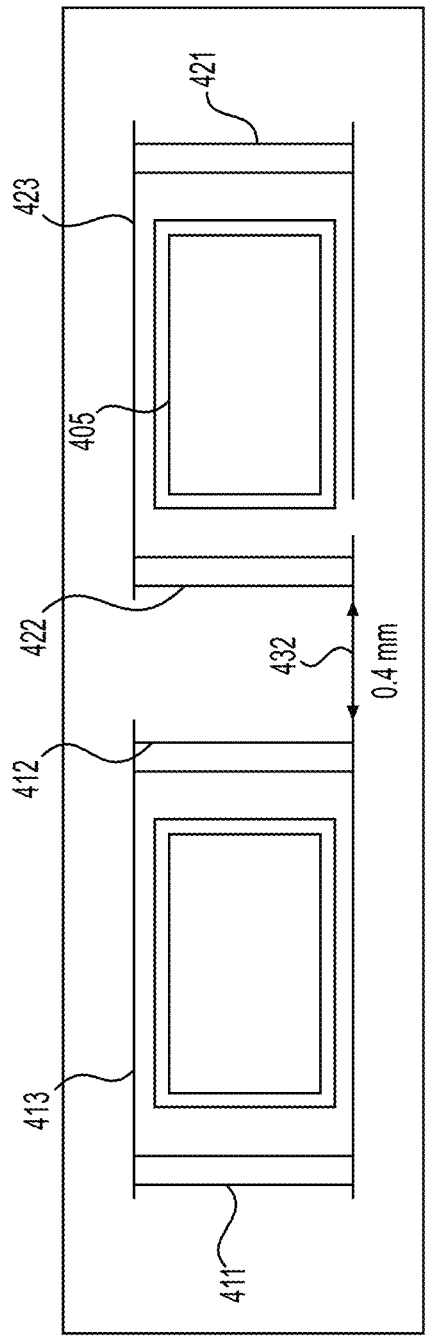
FIG. 2 represents a side sectional view of the device shown in FIG. 1.

The magnetic core 110 can be a ferrite core as this can provide the device with the desired inductance. Other types of magnetic materials, and even air cores, that are each an unfilled cavity formed between the windings of the transformer, are also possible. Although, in the examples above, the magnetic core 110 has an octagonal shape, it may have different shapes. The octagonal shape of the magnetic core 110 increases or maximizes the magnetic space within the magnetic core for the induced magnetic field and the physical space for the vias 525 and 535. The magnetic core 110 can be coated with an insulating material to reduce the possibility of breakdown occurring between the conductive magnetic core 110 and the vias 525 and 535 or traces. This configuration of having the primary winding close to the secondary winding improves transformer performance characteristics of coupling, inductance, and resistance, while minimizing or decreasing the physical size of the transformer. For example, the coupling can be improved from about 0.916 from the configuration shown in FIG. 1 to about 0.991 in the configuration shown in FIGS. 4-8. Additionally, leakage inductance, and thus the resonant frequency of a resonant converter such as the one shown in FIG. 3 that uses embedded transformer, can be controlled by overlapping portions of the primary and secondary windings 120 and 130.

Additional winding(s) can be included on the other portion of the magnetic core 110 that does not include any windings. However, in this case, the physical size of the transformer would increase and the size of the opening through the magnetic core 110 would also need to increase to accommodate the additional necessary through holes.

FIG. 5 also shows examples of possible dimensions of the distances between the layers of the inner and outer winding layers of about 0.28 mm or about 0.21 mm and of the distance between the metal layers of the primary winding 120 and the vias 535 of the secondary winding 130 at about 0.4 mm. To meet the insulation requirements of EN/UL60950, approximately 0.4 mm separation is required through a solid insulator for mains referenced voltages (250 Vrms), for example.

If the added insulating layers and the substrate are FR4, then FIG. 5 shows the primary windings 120 and secondary windings 130 can be vertically separated (i.e., the distance between adjacent traces of the primary windings 120 and secondary windings 130) by two insulation layers each with a thickness of about 0.14 mm within manufacturing and measurement tolerances (i.e., a total of about 0.28 mm within manufacturing and measurement tolerances) or can be vertically separated by three insulation layers each with a thickness of about 0.07 mm within manufacturing and measurement tolerances (i.e., a total of about 0.21 mm within manufacturing and measurement tolerances). FIG. 5 also shows that the primary windings 120 and the secondary windings 130 can be horizontally separated (i.e., the shortest distance between traces or vias of the primary winding and the vias of the secondary winding) by about 0.4 mm within manufacturing and measurement tolerances.

The IEC and UL safety standards require the distances between the electric windings to be more than 0.4 mm when the windings are integrated in the same layer of a substrate. In other rules of the IEC and UL standards, a dielectric "thin film sheet" is applied to the isolation that should be secured in the vertical direction. When a material is used for the substrate with an isolation distance of about 30 kV/mm, a minimum separation of about 0.28 mm is required with two dielectric layers, for example. With three dielectric layers, the minimum distance should be about 0.21 mm, for example. Accordingly, the isolation distances in the horizontal and vertical directions can be different from each other. The vias 525 and 535 are formed at suitable locations to form the primary and secondary windings 120 and 130 of the embedded transformer. Because the transformer has a magnetic core 110 that is octagonal in shape with a corresponding octagonal-shaped opening in the center, the vias 525 and 535 are therefore suitably formed along portions of the opening and along one side of the outer circumference of the magnetic core 110.

Through-holes can be formed by any combination of drilling, etching, or any other suitable process or technique. The through-holes can then be plated to form vias 525 and 535 that extend between the top and the bottom traces of the corresponding primary and secondary windings 120 and 130.

Traces connecting the respective vias 525 and 535 define portions of the windings of the transformer. The traces and the platings of the vias 525 and 535 are usually formed from copper, and may be formed in any suitable way, such as by adding a copper conductor layer to the outer surfaces of the insulating layer or substrate which is then etched to form the necessary patterns, depositing the copper onto the surface of the insulating layer or substrate, plating the copper onto the insulating layer or substrate, and so on. The width and shape of the traces forming the primary and the secondary windings 120 and 130 can be configured to reduce or minimize resistance. For example, as shown, the width of the traces forming the secondary winding 130 are wider toward the outside of the trace farthest from the opening through the magnetic core 110. Additionally, as shown, there can be two vias 535 used to connect traces defining the secondary winding 130 to reduce or minimize resistance of the longer secondary winding 130. Additional vias can be used to connect the same traces, depending on the width of the traces.

FIGS. 6 and 7 are respective top and bottom perspective views of the embedded transformer of FIG. 4 shown without the materials of the substrate or insulating layers. FIGS. 6 and 7 show the magnetic core 110, the layers of the primary winding 120, the layers of the secondary winding 130, the vias 525 of the primary winding 120, and the vias 535 of the secondary winding. The bottom view of FIG. 7 shows that the primary winding 120 can include winding extensions 122 and 124 that can be used to locate and provide terminals to connect the primary winding 120 to outside circuitry, as shown in FIG. 8.

Like FIG. 7, FIG. 8 is a bottom perspective view of the transformer shown in FIG. 4 and includes terminal posts 129 and 139 used to connect the respective windings to a substrate or circuit. FIG. 8 shows the magnetic core 110, the secondary winding 130 including two terminal posts 139 at two ends of the secondary winding 130, the primary winding 120, and the primary winding extensions 122 and 124 each connected to a terminal post 129 of the primary winding 120. Although not shown, it is also possible to provide, for example, additional terminal posts to center tap a winding.

Figure 9:
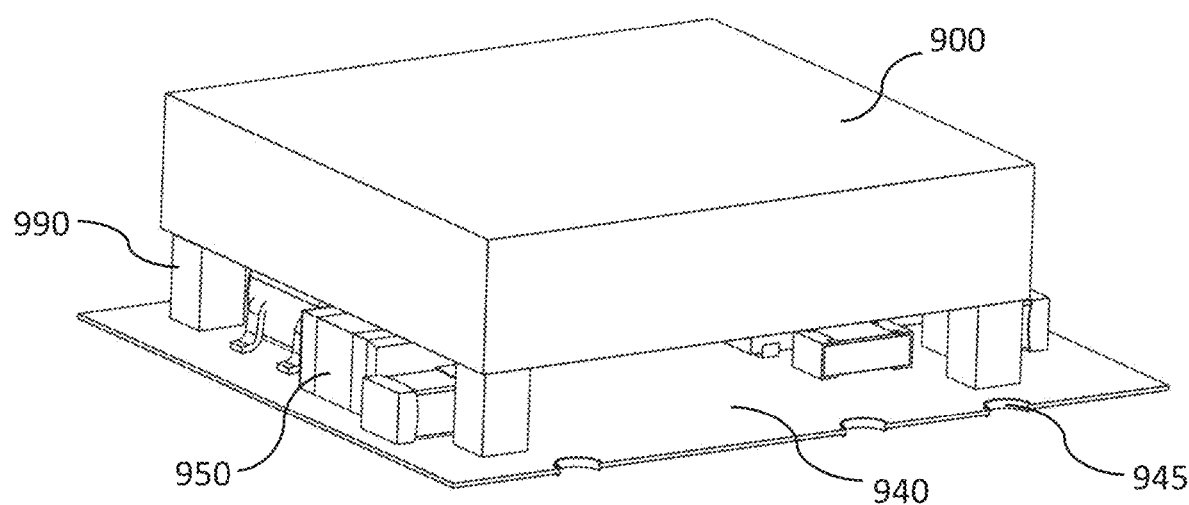
FIGS. 9-11 show a circuit module that includes an embedded transformer.
Figure 10:
Figure 11:
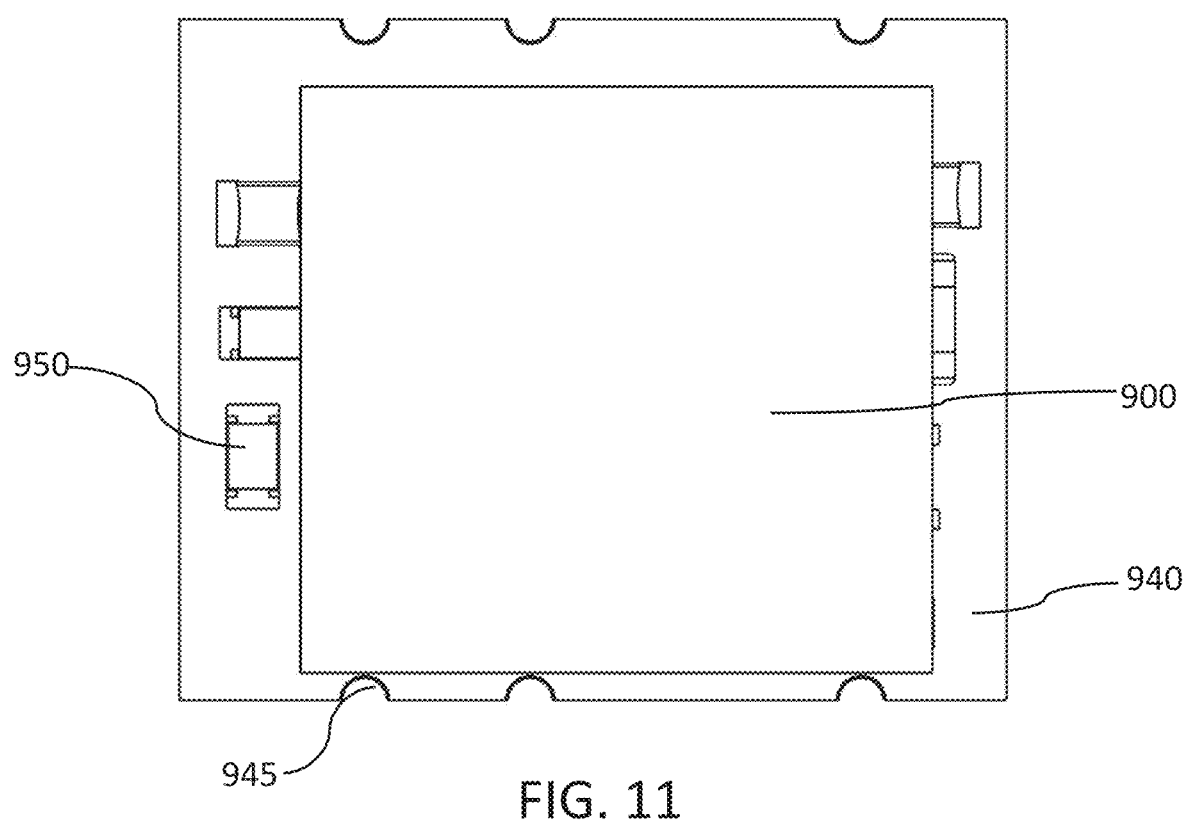

FIGS. 9-11 show a circuit module including an embedded transformer 900 with multi-layer windings. The circuit module can be a DC-DC converter, such as that shown in FIG. 3, a power supply, or any other suitable circuit. As shown, the circuit module can include the embedded transformer 900 mounted to a substrate 940 by terminal posts 990, and circuitry components 950 mounted to the substrate 940 under the transformer 900. The embedded transformer 900 can be structured like that previously described with respect to FIGS. 4-8. Like FIG. 9, FIG. 10 is a perspective view but with the transformer 900 and terminal posts 990 shown as transparent so that the electronic components underneath the transformer 900 are visible.

The substrate 940 can be a printed circuit board (PCB) that is single sided, double sided, or multi-layered. Circuitry components 950 can be mounted on the surface of the substrate that is opposite to the surface to which the transformer 900 is mounted and/or can be mounted on a top surface of the transformer 900.

As shown in FIGS. 9-11 the substrate 940 can include castellations 945 on the edges of the substrate 940. The castellations 945 can be plated indentations or semicircular holes used to mount the substrate 940 to a host substrate. Alternatively, the castellations can be smaller or larger portions of a circle or can be plated holes. The castellations provide proper alignment between the substrate 940 and the host substrate on which the substrate 940 is mounted using soldering or another suitable method. Alternatively, the substrate 940 can include input/output pins, a connector, or any other suitable mechanism providing electrical connection between the circuit module and outside circuitry.

It should be understood that the foregoing description is only illustrative of the present invention. Various alternatives and modifications can be devised by those skilled in the art without departing from the present invention. Accordingly, the present invention is intended to embrace all such alternatives, modifications, and variances that fall within the scope of the appended claims.

The invention claimed is:

1. An embedded magnetic component device comprising:
   an insulating substrate including a first side, a second side opposite the first side, and a cavity;
   a magnetic core included in the cavity and including an inner periphery and an outer periphery;
   a first electrical winding that extends through the insulating substrate and around the magnetic core; and
   a second electrical winding that extends through the insulating substrate and around the magnetic core, wherein
   each of the first and the second electrical windings includes:
      upper traces located on the first side of the insulating substrate;
      lower traces located on the second side of the insulating substrate;
      inner conductive connectors extending through the insulating substrate adjacent to the inner periphery of the magnetic core, the inner conductive connectors respectively defining electrical connections between respective upper traces and respective lower traces; and
      outer conductive connectors extending through the insulating substrate adjacent to the outer periphery of the magnetic core, the outer conductive connectors respectively defining electrical connections between the respective upper traces and the respective lower traces, the first electrical winding is closer to the magnetic core than the second electrical winding.

2. The embedded magnetic component device of claim 1, wherein the upper and lower traces of the second electrical winding are wider than the upper and lower traces of the first electrical winding.

3. The embedded magnetic component device of claim 1, wherein the second electrical winding includes two outer conductive connectors between each of the respective upper traces and each of the respective lower traces.

4. The embedded magnetic component device of claim 1, wherein the second electrical winding overlaps the first electrical winding.

5. The embedded magnetic component device of claim 1, wherein
the upper traces of the first electrical winding are on a different layer of the insulating substrate than the upper traces of the second electrical winding, and
the lower traces of the first electrical winding are on a different layer than the upper traces of the second electrical winding.

6. The embedded magnetic component device of claim 1, wherein the magnetic core is octagonally shaped.

7. The embedded magnetic component device of claim 1, further comprising:
a first isolation layer located on the first side of the insulating substrate between the first electrical winding and the second electrical winding; and
a second isolation layer located on the second side of the insulating substrate between the first electrical winding and the second electrical winding.

8. The embedded magnetic component device of claim 7, wherein the first isolation layer and/or the second isolation layer include a single layer.

9. An electrical circuit comprising:
a circuit substrate;
the embedded magnetic component device of claim 1 mounted to a first surface of the circuit substrate; and
electronic components mounted on the first surface of the circuit substrate between the embedded magnetic component device and the circuit substrate.

10. The electrical circuit of claim 9, wherein electronic components are mounted on a second surface of the circuit substrate that is opposite to the first surface.

11. A method of manufacturing an embedded magnetic component device, the method comprising:
forming a cavity in an insulating substrate that includes a first side and a second side opposite the first side;
installing a magnetic core in the cavity, the magnetic core including an inner periphery and an outer periphery;
forming a first electrical winding that extends through the insulating substrate and around the magnetic core; and
forming a second electrical winding that extends through the insulating substrate and around the magnetic core; wherein
each of the first and the second electrical windings includes:
upper traces located on the first side of the insulating substrate;
lower traces located on the second side of the insulating substrate;
inner conductive connectors extending through the insulating substrate adjacent to the inner periphery of the magnetic core, the inner conductive connectors respectively defining electrical connections between respective upper traces and respective lower traces; and
outer conductive connectors extending through the insulating substrate adjacent to the outer periphery of the magnetic core, the outer conductive connectors respectively defining electrical connections between the respective upper traces and the respective lower conductive traces; wherein
the first electrical winding is closer to the magnetic core than the second electrical winding.

12. The method of claim 11, wherein the upper and lower traces of the second electrical winding are wider than the upper and lower traces of the first electrical winding.

13. A device comprising:
a substrate;
a magnetic core in the substrate and including a hole;
a first winding extending through the hole and around the magnetic core; and
a second winding extending through the hole, around the magnetic core, and around a portion of the first winding; wherein
the first and the second windings only extend around a same half of the magnetic core.

14. The device of claim 13, wherein
each of the first and the second windings includes top and bottom traces connected by inner and outer traces;
the top traces of the first winding and the top traces of the second winding are on different layers of the substrate;
the bottom traces of the first winding and the bottom traces of the second winding are on different layers of the substrate;
inner vias of the first and the second windings are located within the hole; and
outer vias of the first and the second windings are located on an exterior of the magnetic core.

15. The device of claim 14, wherein
the inner vias of the first winding are arranged in first and second rows; and
the inner vias of the second winding are arranged in a third row.

16. The device of claim 14, wherein
the magnetic core has an octagonal shape; and
the outer vias of the primary windings and the secondary windings are arranged along three sides of the magnetic core.

17. The device of claim 14, further comprising a first insulation layer between the top traces of the first winding and the top traces of the second winding.

18. The device of claim 17, further comprising:
a second insulation layer covering the top traces of the second winding; and
a third insulation layer covering the bottom traces of the second winding.

19. A module comprising:
a module substrate; and
the device of claim 13 mounted to the module substrate.

20. The module of claim 19, wherein the module is a resonant converter with a resonant frequency determined by an overlap of the first and the second windings.

* * * * *